US006518811B1

(12) United States Patent
Klecka, III

(10) Patent No.: US 6,518,811 B1
(45) Date of Patent: Feb. 11, 2003

(54) SOFTWARE PROGRAMMABLE DELAY CIRCUIT

(75) Inventor: Rudolph B. Klecka, III, Dallas, TX (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 09/752,367

(22) Filed: Dec. 29, 2000

(51) Int. Cl.[7] .............................................. H03H 11/26
(52) U.S. Cl. ...................................... 327/276; 327/277
(58) Field of Search ................................ 327/262, 263, 327/264, 265, 266, 267, 268, 269, 270, 271, 272, 273, 274, 226, 276, 277, 278, 279, 280; 375/346, 347

(56) References Cited

U.S. PATENT DOCUMENTS

| 4,246,656 A | * | 1/1981 | Wood et al. ................. 375/347 |
| 5,790,611 A | | 8/1998 | Huang et al. ................ 327/161 |
| 5,946,268 A | | 8/1999 | Iwamoto et al. ............ 365/194 |
| 6,052,007 A | | 4/2000 | Ono ........................... 327/153 |
| 6,088,255 A | | 7/2000 | Matsuzaki et al. .......... 365/233 |
| 6,125,157 A | | 9/2000 | Donnelly et al. ............ 327/141 |
| 6,157,234 A | * | 12/2000 | Yamaguchi ................. 327/263 |
| 6,191,632 B1 | | 2/2001 | Iwata et al. ................. 327/262 |
| 6,194,930 B1 | | 2/2001 | Matsuzaki et al. .......... 327/156 |
| 6,222,407 B1 | * | 4/2001 | Gregor ........................ 327/269 |
| 6,229,367 B1 | * | 5/2001 | Choudhury ................. 327/269 |
| 6,233,205 B1 | * | 5/2001 | Wells et al. ................. 327/263 |
| 6,275,091 B1 | * | 8/2001 | Saeki .......................... 327/277 |
| 6,297,679 B1 | * | 10/2001 | Kim ............................ 327/276 |
| 6,304,124 B1 | * | 10/2001 | Mizuno ...................... 327/276 |

* cited by examiner

Primary Examiner—Timothy P. Callahan
Assistant Examiner—Linh Nguyen
(74) Attorney, Agent, or Firm—Campbell Stephenson Ascolese LLP

(57) ABSTRACT

A phase adjustment circuit has a signal path having a plurality of phase adjustment elements coupled together. Each of the phase adjustment elements of the plurality has a first path and a second path. The second path of each of the phase adjustment elements of the plurality adds a smaller amount of phase adjustment to the signal path than the first path of each of the phase adjustment elements of the plurality. The amount of phase adjustment added by each of the phase adjustment elements of the plurality is cumulative. The phase adjustment circuit also has a selection circuit coupled to each of the phase adjustment elements of the plurality to provide selection of either the first path or the second path of each of the phase adjustment elements of the plurality.

17 Claims, 6 Drawing Sheets

SOFTWARE PROGRAMMABLE DELAY CIRCUIT

CROSS-REFERENCE TO RELATED APPLICATIONS

This application relates to co-pending U.S. patent application Ser. No. 09/751,995, filed on Dec. 29, 2000, entitled "Method and Apparatus For Phase Aligning Two Clock Signals Utilizing a Programmable Phase Adjustment Circuit" and naming Rudolph Benedict Klecka III as inventor, the application being incorporated herein by reference in its entirety.

BACKGROUND OF THE INVENTION

1. Field of the Invention

The present invention relates generally to delay circuits and more particularly to providing a programmable digital delay circuit in a programmable device that is routing independent.

2. Description of the Related Art.

The first generations of fiber-optic systems in the public telephone network used proprietary architectures, equipment, line codes, multiplexing formats, and maintenance procedures. These transmission systems were asynchronous, with each terminal or hub in the network running on a different clock. In digital transmission, a clock refers to a series of repetitive pulses that keep the bit rate of data constant and indicate the location of ones and zeroes in a data stream. Since the clocks in the first generation systems were not synchronized, large variations occurred in the clock rate and thus the signal bit rate.

The synchronous optical network (SONET) standard was developed to provide a synchronous optical system that enables the interconnection of equipment from different suppliers without causing large variations in the clock rate and the signal bit rate. The SONET standard defines a technology for carrying many signals of different capacities through a synchronous, flexible, optical hierarchy. SONET defines a set of synchronous signals, including optical carrier (OC) levels and electrically equivalent synchronous transport signals (STSs) for the fiber-optic-based transmission hierarchy. A similar standard to SONET is the Synchronous Digital Hierarchy (SDH) which is the optical fiber standard predominantly used in Europe. There are only minor differences between the two standards. Accordingly, hereinafter any reference to the term SONET refers to both SDH and SONET networks, unless otherwise noted.

In a set of synchronous signals, digital transitions occur at exactly the same rate. There can, however, be a phase difference between the transitions of the two signals, which must lie within specified limits. The phase differences can be due to propagation time delays or jitter introduced into the transmission network. In the synchronous network defined by SONET, all clocks are traceable to one primary reference clock (PRC), also referred to as a Stratum 1 atomic clock. The accuracy of the PRC is better than +−1 in $10^{11}$.

SONET utilizes a byte-interleaved multiplexing scheme. Mulitplexing enables one physical medium to carry multiple signals. Byte-interleaving simplifies multiplexing and offers end-to-end network management. Each STS is transmitted on a link at regular time intervals (for example, 125 microseconds) and grouped into frames. See Bellcore Generic Requirements document GR-253-CORE (Issue 2, December 1995), hereinafter referred to as "SONET Specification," and incorporated herein by reference for all purposes. The first step in the SONET multiplexing process involves the generation of the lowest level or base signal. In SONET, this base signal is referred to as synchronous transport signal—level 1, or simply STS-1, which operates at 51.84 Mbps. Higher-level signals are integer multiples of STS-1, creating the family of STS-N signals in Table 1. An STS-N signal is composed of N byte-interleaved STS-1 signals. Table 1 also includes the optical counterpart for each STS-N signal, designated optical carrier level N (OC-N).

TABLE 1

| SIGNAL | BIT RATE (Mbps) |
| --- | --- |
| STS-1, OC-1 | 51.840 |
| STS-3, OC-3 | 155.520 |
| STS-12, OC-12 | 622.080 |
| STS-48, OC-48 | 2,488.320 |
| STS-192, OC-192 | 9,953.280 |

NOTE:
Mbps = Mega bits per second
STS = synchronous transport signal
OC = optical carrier SONET organizes STS data streams into frames, consisting of transport overhead and a synchronous payload envelope. The overhead consists of information that allows the network to operate and allow communications between a network controller and nodes. The transport overhead includes framing information and pointers, and performance monitoring, communications and maintenance information. The synchronous payload envelope is the data to be transported throughout the network, from node to node until the data reaches its destination.

SONET utilizes pointers to accommodate differences in the reference source frequencies and phase wander and to prevent frequency differences during synchronization failures. Adjustments to the pointers compensate for frequency and phase variations. The use of pointers avoids the delays and loss of data associated with the transmission of large amounts of data. A pointer is an offset value that points to the byte where the payload begins in the frame. The pointer allows the payload to be separated from the transport overhead. If there are any frequency or phase variations between the frame and the associated payload, the pointer value will be increased or decreased accordingly to maintain synchronization. When there is a difference in phase or frequency, the pointer value is adjusted. To accomplish this, a process known as byte stuffing is used. In other words, the payload pointer indicates where in the frame the payload starts, and the byte-stuffing allows dynamic alignment of the payload in case the payload slips in time.

Routers, cross-connect systems, and other network nodes are commonly employed in the telecommunication network synchronization hierarchy. The network is organized with a master-slave relationship with clocks of the higher level nodes feeding timing signals to clocks of the lower-level nodes. All nodes can be traced up to the primary reference source, a Stratum 1 atomic clock with extremely high stability and accuracy. The internal clock of a SONET hub derives the hub's timing signal from a Building Integrated Timing Supply (BITS) clock used by switching systems and other equipment. The hub serves as a master for other SONET nodes, providing timing on the hubs' outgoing OC-N signal. Current standards specify that a SONET network must be able to derive the internal timing from a Stratum 3 or higher clock. A SONET optical cross connect accepts various optical carrier rates, accesses the STS-1 signals, and switches at this level.

A common feature of a telecommunication system node is the redundancy built into the architecture. Redundancy refers to providing a duplicate set of circuitry that functions as a backup system in case of a failure. At any given time, one set of circuitry is designated as active while the other is designated standby. When a failure occurs in a portion of the active circuitry, the corresponding standby circuitry is switched to active and the active circuitry is switched to standby, allowing the circuitry to be repaired without bringing the system into a non-operational state. In addition, the redundancy in the architecture provides for other activities, such as routine maintenance and circuit or software upgrades to occur while allowing the system to continue functioning. Although circuitry is designated as either active or standby, both circuits can be fully operational. The outputs of the redundant circuits are monitored and compared for performance and failures.

In a SONET hub, clocks are derived from the BITS clock and then distributed throughout the hub. Processors, electrical components, control signals, etc. need clock signals to run properly. To provide clock inputs to all of these circuits, the original clock signal needs to be duplicated, typically via clock trees utilizing layers of clock buffers. Clock buffering, as well as loading, routing, temperature, and voltage differences lead to phase misalignment between the derived clock signals. Routing, duplication and selection of clock signals due to the redundancy of the architecture further increases the phase difference between clock signals.

Unless compensated for, the clock operating the active circuitry can have a large phase difference from the clock operating the standby circuitry. In some designs, the phase difference does not affect the operation of the system except when switching between active and standby circuitry. The phase difference, if not corrected, can cause data loss. To avoid such errors, the standby clock must be phase-aligned with the active clock prior to switching the standby circuitry to active.

FIG. 1 illustrates a prior art circuit for synchronizing two clocks. The synchronization of two clock signals is typically performed by a phase locked loop ("PLL") or other analog circuitry. Two clocks, labeled CLK A and CLK B, are fed into a multiplexer 105. One of CLK A or CLK B is selected as an ACTIVE CLK by multiplexer 105 and is fed into a phase detector 110 with a FEEDBACK CLK. Phase detector 110 detects the phase difference between ACTIVE CLK and FEEDBACK CLK. The phase difference output is sent through a low pass filter 120 and an amplifier 130 and controls the frequency of a voltage controlled oscillator (VCO) 140. The phase difference output that is generated by phase detector 110 is used to retune the frequency of VCO 140 whenever ACTIVE CLK deviates from FEEDBACK CLK, such as when switching multiplexer 105 from selecting CLK A or CLK B as ACTIVE CLK. The frequency of VCO 140 is driven toward the frequency of ACTIVE CLK. FEEDBACK CLK tracks the phase of ACTIVE CLK and locks to ACTIVE CLK through the feed back loop. The frequency of FEEDBACK CLK is adjusted during the synchronization process. Because FEEDBACK CLK is typically used to clock the active circuitry, the change in frequency during the synchronization process can cause a loss of data.

In an optical cross-connect supporting the SONET standard, the hub clocks are used to control pointers and timing within a frame and thus cannot withstand large changes in frequency. Using a PLL to synchronize clocks causes a change in frequency of the feedback clock during synchronization. The change in frequency can result in data loss.

Rather than using a PLL to phase align clock signals, a phase adjustment can be added to a standby clock using digital circuitry. Typically, the phase difference between two clocks is measured using a much higher frequency clock. For example, for two clocks operating at 50 MHz, a 10 GHz clock can be used to count the amount of time between a rising edge of the first clock signal and the next rising edge of the second clock signal to determine the phase misalignment. The use of a 10 GHz clock provides phase alignment within approximately 100 ps (picoseconds). The use of a much higher clock frequency is often limited due to technology constraints. For example, in an FPGA (Field Programmable Gate Array), a 50 MHz clock is easily handled by the CMOS technology. However, the CMOS technology in an FPGA cannot handle a clock frequency as high as 10 GHz. Therefore, the phase adjustment circuitry can be located outside the FPGA or more expensive technology can be used.

The design of digital circuitry to provide a variable amount of phase adjustment is difficult due to the need to place restrictions on the placement and routing of the components in a digital device. Adherence to strict layout parameters often requires costly and time consuming placement and routing of the phase adjustment circuitry and often leads to undesirable delay of any other circuitry in the digital device.

A method and apparatus for phase adjusting a clock signal is needed that provides for a variable amount of phase adjustment, that will not change signal's frequency, and that can be accomplished in a cost effective manner.

SUMMARY OF THE INVENTION

A method and apparatus for phase adjusting a clock signal is disclosed. The invention provides for a variable amount of phase adjustment to be added to a signal path. The frequency of the signal is not modified. The layout and routing of the design in an application specific integrated circuit is easily implemented.

A phase adjustment circuit has a signal path comprising a plurality of phase adjustment elements coupled together. Each of the phase adjustment elements of the plurality has a first path and a second path. The second path of each of the phase adjustment elements of the plurality adds a smaller amount of phase adjustment to the signal path than the first path of each of the phase adjustment elements of the plurality. The amount of phase adjustment added by each of the phase adjustment elements of the plurality is cumulative. The phase adjustment circuit also has a selection circuit coupled to each of the phase adjustment elements of the plurality to provide selection of either the first path or the second path of each of the phase adjustment elements of the plurality.

In another embodiment, a computer readable medium has a set of instructions for enabling a system to select a first path or a second path of each of a plurality of phase adjustment elements, wherein the first path adds a greater amount of phase adjustment to a signal path than the second path.

The foregoing is a summary and thus contains, by necessity, simplifications, generalizations and omissions of detail; consequently, those skilled in the art will appreciate that the summary is illustrative only and is not intended to be in any way limiting. As will also be apparent to one of skill in the art, the operations disclosed herein may be implemented in a number of ways, and such changes and modifications may be made without departing from this invention and its broader aspects. Other aspects, inventive features, and advantages of the present invention, as defined solely by the claims, will become apparent in the non-limiting detailed description set forth below.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

The following is intended to provide a detailed description of an example of the invention and should not be taken to be limiting of the invention itself. Rather, any number of variations may fall within the scope of the invention that is defined in the claims following the description.

Figure 1:
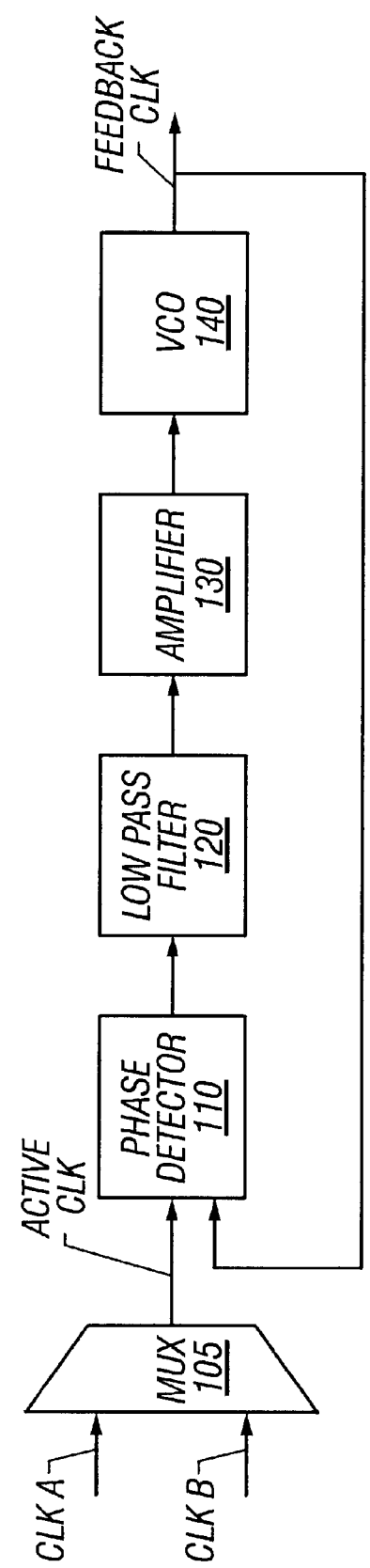
FIG. 1 illustrates a prior art circuit for synchronizing two clocks.
Figure 2:
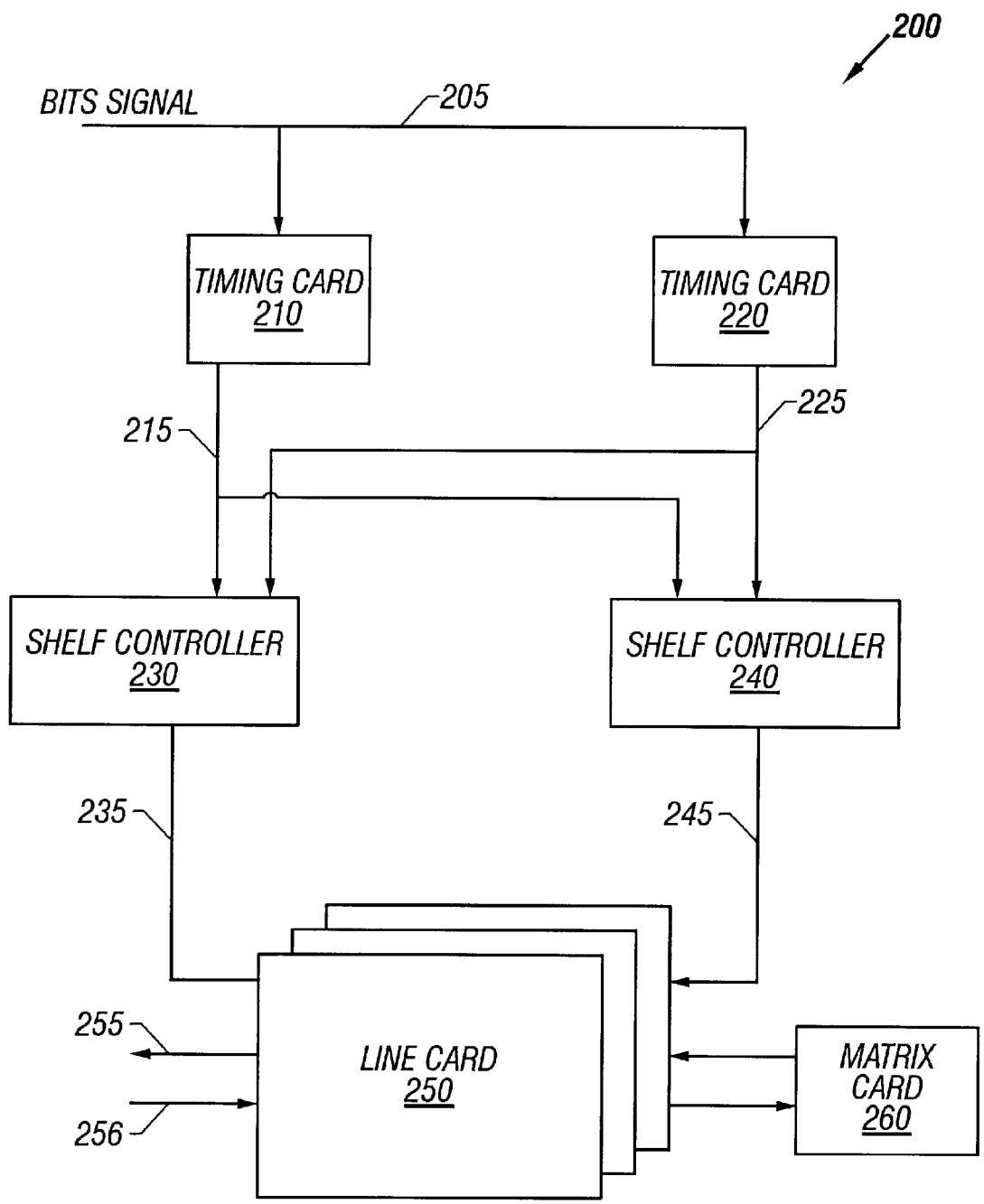
FIG. 2 is a block diagram illustrating clock routing in portions of an optical cross connect system in which embodiments of the present invention can be practiced.

FIG. 2 is a block diagram illustrating clock routing in portions of an optical cross-connect system in which embodiments of the present invention can be practiced. Optical cross connect 200 is a high-capacity telecommunication network device based on optical and electronic communication technologies and components that provides routing, grooming and restoration at the wavelength levels as well as wavelength based services. Optical cross connect 200 interconnects routers and switches across an optical transport network, accepting various wavelengths on input ports and routing them to appropriate output ports in the network. Optical cross connect 200 provides routing for traffic at wavelength granularities (e.g., OC-48 and OC-192) and enables functionality to be controlled by software managed centrally.

Optical cross connect 200 preferably provides redundancy at all levels to prevent any single point system failure. Optical cross connect 200 preferably has two redundant copies located in separate bays, and all processors, memory and communications are preferably 1:1 redundant. For the sake of clarity, only redundant copies of the timing card and shelf controller are shown in FIG. 2.

Referring to FIG. 2, the internal clock of optical cross connect 200 is derived from a Building Integrated Timing Supply (BITS) signal 205 which is an input signal to timing card 210 and timing card 220. Timing card 210 and timing card 220 perform the derivation from the BITS signal to all internal timing signals needed in optical cross connect 200, providing the synchronous signaling required of the SONET protocol. One of timing card 210 or timing card 220 is designated as active, while the other is designated as standby.

A clock output 215 of timing card 210 is sent to both shelf controller 230 and shelf controller 240. Additionally, a clock output 225 of timing card 220 is sent to both shelf controller 230 and shelf controller 240. Each shelf controller receives a clock from each timing card to enable selection of the clock signal from the active timing card.

Each shelf controller is responsible for managing and controlling multiple line cards. Some of the functions handled by the shelf controller include the periodic collection of maintenance data from the line cards, receiving and processing periodic keep-alive messages from those cards, shelf startup and configuration, proxy management, and other related functions. Only line card 250 is labeled and discussed herein, although a shelf controller typically controls a number of line cards.

Shelf controller 230 passes its active clock 235 to line card 250. Shelf controller 240 passes its active clock 245 to line card 250. Line card 250 receives a clock signal from each shelf controller to enable the selection of the clock signal from the active shelf controller. On the line side, line card 250 is coupled to two fiber optic cables 255 and 256, one for each direction. Fiber optic cables 255 and 256 support optical communication via a SONET data stream (a OC-48 or a OC-192 data stream, for example). Line card 250 is coupled to matrix card 260 that provides routing and switching between other line cards.

Line card 250 performs actions related to various aspects of the SONET protocol, which may include, for example, framing, insertion and extraction of embedded data channels, error checking, pointer processing, clock recovery, and multiplexing/duplexing. Data enters the system at line card 250 via a SONET data stream on fiber optic cable 256. The transport overhead is typically stripped off in the line card to extract overhead information and payload from the data stream. The extracted SONET payload envelope is then synchronized with the system clock and sent to matrix card 260. Data leaving the system is processed by the transmit section of line card 250, which inserts all required transport overhead bytes into the outgoing stream.

As previously mentioned, all data timing in optical cross connect 200 is derived from the BITS clock 205. Due to the redundant architecture, only one clock output 215 or 225 from timing card 210 and timing card 220 to each shelf controller is designated active and only one clock output 235 or 245 from shelf controller 230 and shelf controller 240 to line card 250 is designated active. Although a clock is designated as standby, the clock may still be functional and operational. The clock sent from the standby circuitry has the same frequency as the clock from the active circuitry because the clocks were derived from the same signal. However, the clocks can be phase shifted from each other due to delays from different routing, voltage, temperature, and other differing conditions in the redundant circuitry. When switching timing card 210 to active from standby and timing card 220 to standby from active, (or vice versa) circuitry on each shelf controller 230 and 240 must phase align the two clocks 215 and 225 received prior to switching the active or standby designation of the timing cards. Similarly, when switching shelf controller 230 to active from standby and shelf controller 240 to standby from active (or vice versa), circuitry on line card 250 must phase align clocks 235 and 245, prior to switching the active or standby designation of the shelf controllers. The circuitry for the phase alignment maybe identical on each shelf controller and line card 250.

Figure 3:
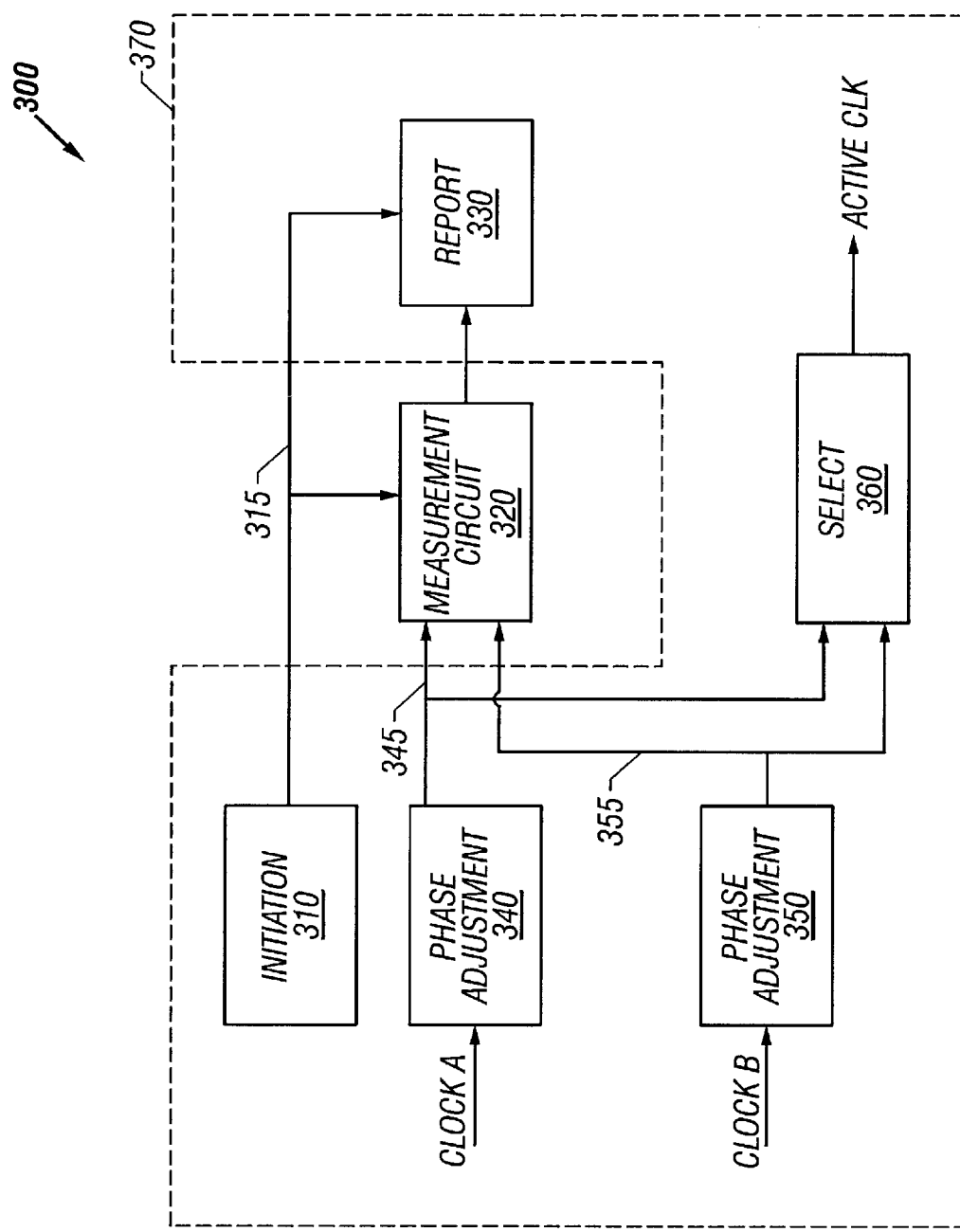
FIG. 3 illustrates a phase aligner according to embodiments of the present invention.

FIG. 3 illustrates a phase aligner 300 according to embodiments of the present invention. Phase aligner 300 can be located, for example, on each shelf controller and on each line card, each containing various other circuitry including electronic devices such as a processor, programmable devices, and other electronic components. As previously explained, the two input clock signals, clock A and clock B, are frequency locked, but may have phase differences. The phases of clock A and clock B must be aligned so that the system can gracefully switch from active circuitry to standby circuitry, and vice versa without causing data loss. To align the clock signals, the phase of the standby clock is preferably brought into alignment with the active clock.

Referring to FIG. 3, for discussion purposes clock B is designated as the active clock and clock A is designated as the standby clock. Upon receiving the intent to switch between the active and standby circuitry and the associated clocks, initiation block 310 sends a begin measurement signal 315 to measurement circuit 320 and reporting circuit 330. Clock A is an input signal to phase adjustment circuit 340. Phase adjustment circuit 340 contains selectable phase alignment circuitry to modify the phase of clock A. Because clock A is designated as standby, the phase adjustment select circuitry of phase adjustment circuit 340 has been previously set to minimum phase adjustment. The phase modified clock A signal 345 is sent to measurement circuit 320 and select circuit 360. Clock B is an input to phase adjustment circuit 350. Phase adjustment circuit 350 contains selectable phase alignment circuitry to modify the phase of clock B similar to the circuitry contained in phase adjustment circuit 340. Phase adjustment circuits 340 and 350 are discussed in greater detail in regard to FIGS. 4 and 5. The phase modified clock B signal 355 is sent to measurement circuit 320 and select circuit 360. Measurement circuit 320 measures the phase difference between the two modified clock signals 345 and 355. Measurement circuit 320 notifies reporting circuit 330 upon completion of measurement. Reporting circuit 330 obtains the measured phase difference, which is then readable by software. Reporting circuit 330 notifies software of measurement completion by either sending an interrupt or by polling (e.g., setting a bit in a register to indicate measurement completion which software is configured to periodically read).

Software determines the amount of phase adjustment needed to bring the phase modified clock A signal 345 into phase alignment with the phase modified clock B signal 355. Software selects the phase adjustment to be added to clock A in phase adjustment circuit 340. The phase difference is measured and again reported. The software may perform several iterations of adding phase adjustment and measuring the phase difference. These iterations continue until the phase difference is within a desired minimum amount. When the clocks are sufficiently aligned, the active and standby circuitry can be switched. Select circuit 360 selects phase modified clock A signal 345 as the active clock. The phase adjustment selects for the standby clock, now clock B, are set to the minimum phase adjustment. Phase adjustment is typically not performed on an active clock. Preferably, the standby clock is brought into phase alignment with the active clock. When clock B is used to generate the active clock, the selects of phase adjustment circuit 350 are programmed to adjust the phase of clock A.

Figure 6:
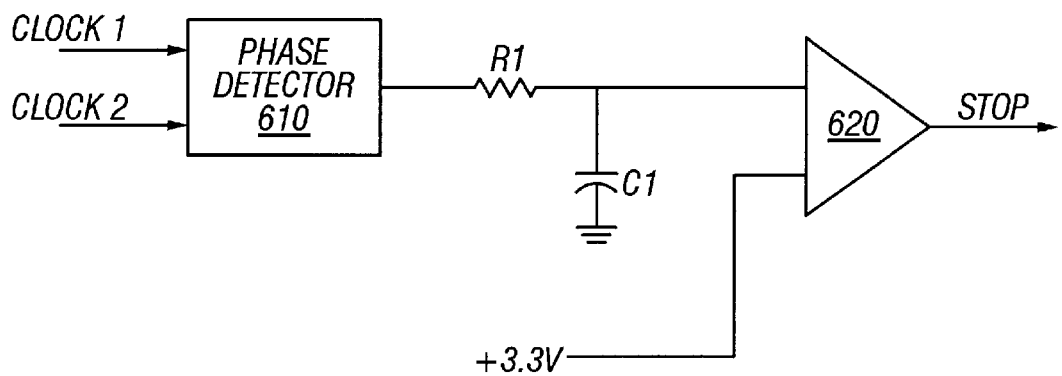
FIG. 6 illustrates an example phase measurement circuit.

The highlighted area 370 indicates the elements of phase aligner 300 that can be contained within a digital circuit, for example, a field programmable gate array (FPGA). Measurement circuit 320 is typically analog circuitry used to measure a phase difference between two clocks, an example of which is illustrated in FIG. 6.

Figure 4:
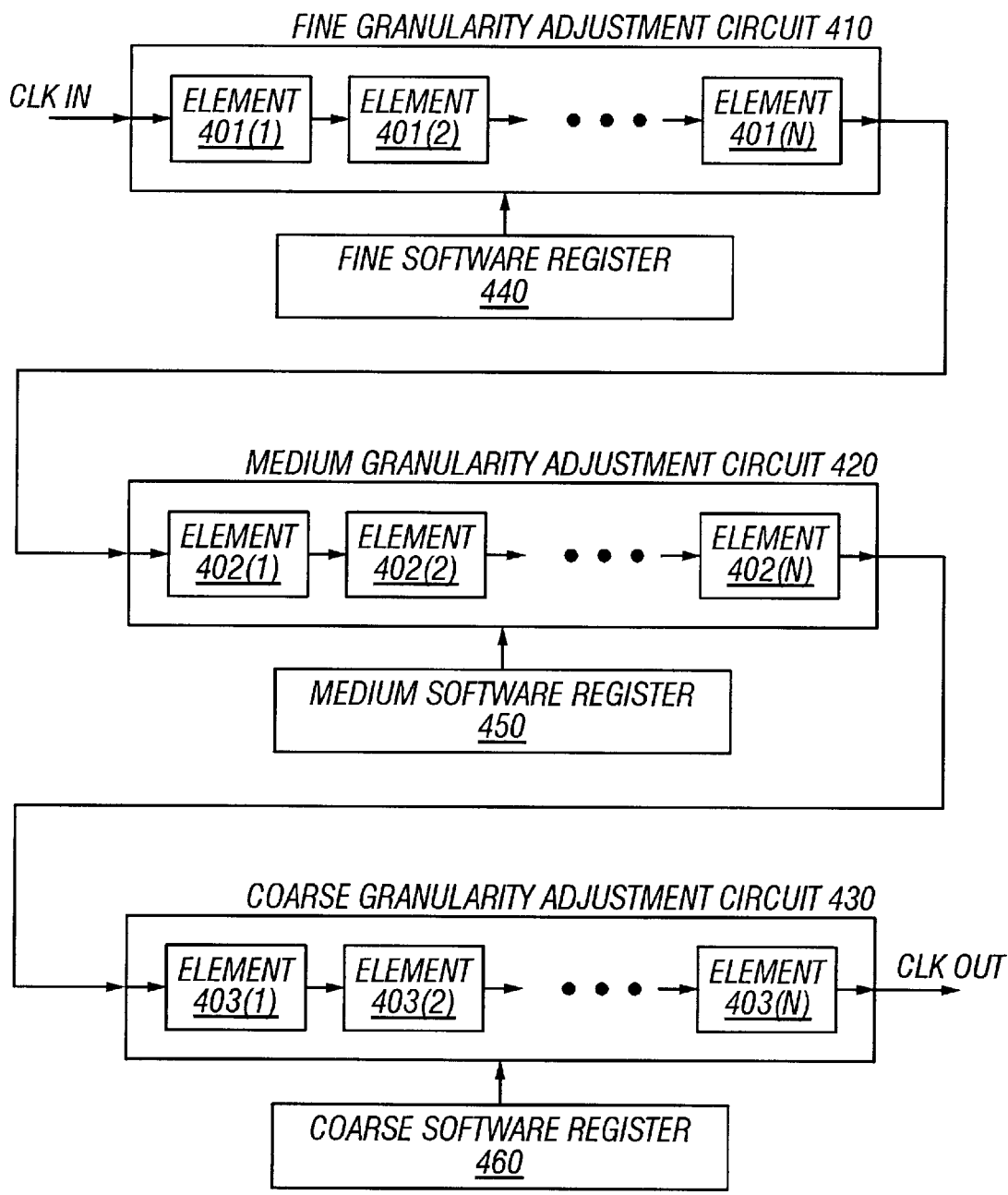
FIG. 4 illustrates the components of a phase adjustment circuit according to an embodiment of the present invention.

FIG. 4 illustrates the components of a phase adjustment circuit according to an embodiment of the present invention. The CLK IN signal is input to a series of circuits consisting of fine granularity adjustment circuit 410, medium granularity adjustment circuit 420 and coarse granularity adjustment circuit 430. The granularity adjustment circuits can be in any order because they are implemented in series and the phase adjustments that they add to the CLK IN signal are cumulative. Software registers are used to select the amount of adjustment each granularity adjustment circuit provides. Fine software register 440 provides selection information to fine granularity adjustment circuit 410. Medium software register 450 provides selection information to medium granularity adjustment circuit 420. Coarse software register 460 provides selection information to coarse granularity adjustment circuit 430. Upon notification of measurement complete, software determines the amount of coarse, medium and fine phase adjustment needed to bring the clocks into phase alignment. A simple method for selecting can be used, such as pairing each bit in the software register with a select line in the circuitry such that writing all "zeroes" to the software registers adds the minimum phase adjustment, writing all "ones" to the software registers adds the maximum phase adjustment to the input clock, and a combination of "ones" and "zeroes" can be used to select various phase adjustments in between the maximum and the minimum.

Each granularity adjustment circuit (coarse, medium, and fine) contains one or more phase modifying elements connected in series, each receiving select signals from respective software registers. Fine granularity adjustment circuit contains fine phase modifying elements 401(1:N) connected in series, where N can be one or more. Medium granularity adjustment circuit contains medium phase modifying elements 402(1:N) connected in series, where N can be one or more. Coarse granularity adjustment circuit contains coarse phase modifying elements 403(1:N) connected in series, where N can be one or more. Each of coarse phase modifying element 403(1:N) has the ability to add more phase adjustment to the CLK IN signal than each of medium phase modifying element 402(1:N), and each of medium phase modifying element 402(1:N) has the ability to add more phase adjustment to the CLK IN signal than each of fine phase modifying element 401(1:N). Although fine phase modifying elements 401(1:N), medium phase modifying elements 402(1:N), and coarse phase modifying elements 403(1:N) are shown grouped together in the respective granularity adjustment circuits, the elements may be in any order because they are implemented in series and the phase adjustments that they add to the CLK IN signal are cumulative. For example, the ordering of elements may be one fine, one medium, one coarse, one fine, one medium, etc. or any other ordering desired.

It will be noted that the variable identifier "N" is used in several instances in FIG. 4 and other figures (and subsequent use of other variables, such as "m," "x," "k," and others) to more simply designate the final element (e.g., fine phase modifying element 401(N), medium phase modifying element 402(N), and so on) of a series of related or similar elements (e.g., fine phase modifying element 401(1)–(N), medium phase modifying element 402(1)–(N), and so on). The repeated use of such variable identifiers is not meant to imply a correlation between the sizes of such series of elements. The use of such variable identifiers does not require that each series of elements have the same number of elements as another series delimited by the same variable identifier. Rather, in each instance of use, the variable identified by "N" (or "m," "x," "k," and others) may hold the same or a different value than other instances of the same variable identifier. For example, fine phase modifying element 401(N) may be the tenth fine phase modifying element in a series of fine phase modifying elements, whereas medium phase modifying element 402(N) may be the forty-eighth medium phase modifying element in a series of medium phase modifying elements.

Figure 5:
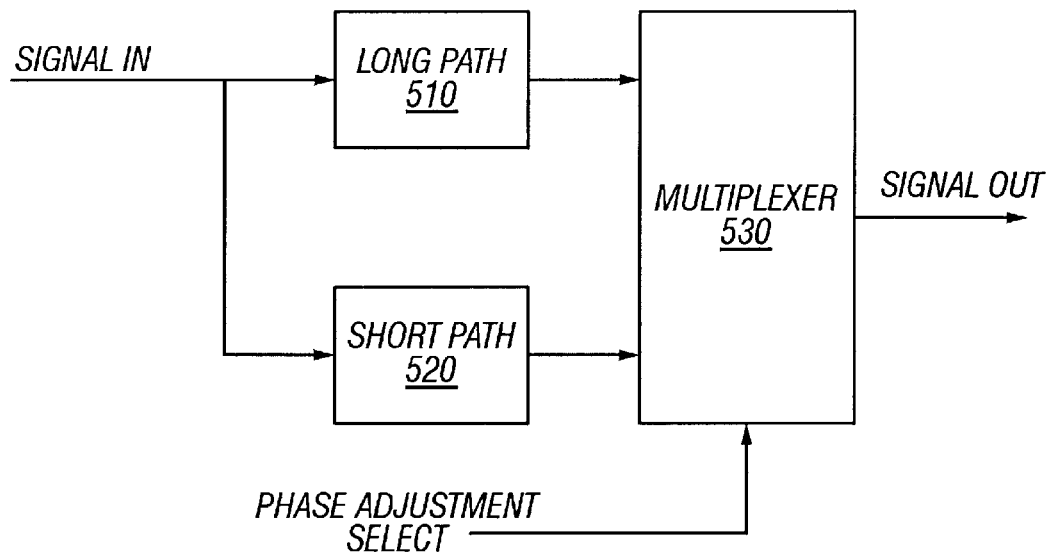
FIG. 5 illustrates the components of a phase modifying element according to embodiments of the present invention.

FIG. 5 illustrates the components of a phase modifying element according to embodiments of the present invention. SIGNAL IN is received as an input to long path circuitry 510 and short path circuitry 520. Long path circuitry 510 adds a greater amount of phase adjustment to SIGNAL IN than short path circuitry 520. Multiplexer 530 receives a PHASE ADJUSTMENT SELECT signal from the associated software register to select the long path phase adjusted SIGNAL IN or the short path phase adjusted SIGNAL IN. The selected signal is then output by multiplexer 530 as SIGNAL OUT.

Phase modifying elements are connected in series such that a variable number of short paths and long paths can be selected to achieve the desired phase adjustment. Multiple coarse phase modifying elements, medium phase modifying elements, and fine phase modifying elements can be connected in series to provide a broad range of phase adjustment to a signal.

In one embodiment of the present invention, a system has two clocks needing phase alignment. The two clocks each have a frequency of 77.76 MHz (Megahertz). The amount of phase adjustment provided by the phase aligner provides the ability to align the two clocks to within 75 ps (picoseconds). Each coarse phase modifying element provides up to 1.5 ns of phase adjustment, the maximum is provided by the long path of the coarse phase modifying element. Sixteen coarse phase modifying elements are contained within the coarse granularity adjustment circuit providing up to 24 ns of phase adjustment. Each medium phase modifying element provides up to 500 ps of phase adjustment, the maximum is provided by the long path of the medium phase modifying element. Sixteen medium phase modifying elements are contained within the medium granularity adjustment circuit providing up to 8 ns of phase adjustment. Each fine phase modifying element provides up to 75 ps of phase adjustment, the maximum is provided by the long path of the fine phase modifying element. Sixteen fine phase modifying elements are contained within the fine granularity adjustment circuit providing up to 1.2 ns of phase adjustment. The amount of phase adjustment available to each granularity adjustment circuit preferably overlaps the other granularity adjustment circuits. In this example, the coarse phase adjustment total per phase modifying element is twice the clock period. As previously explained, since the adjustment added by each fine phase modifying element 401(1:N), medium phase modifying element 402(1:N) and coarse phase modifying element 403(1:N) is cumulative, the phase modifying elements can be connected in any order.

The phase adjustment provided by the phase modifying elements can vary by as much as 30% depending on process, temperature and voltage. The specific delays of 1.5 ns, 500 ps and 75 ps are best case (minimum) delays for each of the long paths of the coarse, medium and fine phase modifying elements, respectively. Worst case (maximum) delays are accounted for by only adding incremental amounts of phase adjustment, re-measuring the phase difference, and repeating the process until the phase difference is within the desired minimum phase difference.

Typically, the greater the frequency of the two clocks, the less the phase adjustment required to bring the clocks into alignment. In addition, more or less granularity (fine, medium, coarse) can be added, such as very coarse, coarse, medium, fine, or very fine, as well as simple providing coarse and/or fine granularity. The number of phase modifying elements in the above embodiment is sixteen per phase granularity circuit, however, any number of phase modifying elements may be used tailored to the requirements of the particular circuitry and timing.

The digital portions of the phase aligner can be implemented in digital logic such as a programmable device or other integrated circuit. A programmable device is an array of gates that are connected by programming fuses. A field programmable gate array (FPGA) is one type of programmable device that has the ability to support complex structure, for example, a Virtex 100™ field programmable gate array from Xilinx, Inc.

The design of digital logic devices, especially those with complex architecture, is performed with the use of a hardware description language (HDL), such as VHDL or Verilog. HDLs are used to describe the architecture and behavior of discrete electronic systems. The circuit is described using HDL code and simulated to verify proper design and architecture. A synthesis tool converts the HDL code into a gate level implementation, optimizing the logic automatically for circuit size and speed.

Delay elements and phase adjustment circuitry are difficult to design using HDL due to the optimization of the synthesis tool and must be designed using configurable logic blocks or hard macros which define and restrict the placement and routing of the logic. Using a configurable logic block, the short path and long path of a phase adjustment element are hand-picked to provide the desired timing. For example, the long and short paths of a coarse phase adjustment element are routed through various combinational gates (e.g., AND, OR, BUFFER, etc.) such that the long path adds 1.5 ns (minimum) delay greater than the short path adds.

The digital portion of phase aligner 300 consists of arrays of phase modifying elements connected in series. To restrict the placement and routing of the entire digital circuit can result in a large logic block that possibly could not be built or fit into the desired device. Instead of restricting the placement and routing of the entire digital circuit, only the design of each phase modifying element is restricted. By restricting only the layout of the individual phase modifying elements, the entire circuit is easier to place and route. Each phase modifying element is a small block of circuitry that can be positioned anywhere in an integrated circuit. The present invention allows flexibility in positioning the phase modifying elements with respect to each other. The connection between the phase modifying elements can be freely routed.

While the routing between each phase modifying element adds phase adjustment to the signal, the additional adjustment has already been taken into account in the measured phase difference. For example, a delay between phase modifying element 401(1) and 401(2) can be 1.5 ns while the delay between phase modifying element 401(2) and phase modifying element 401(3) can be 3 ns. The accumulated 4.5 ns has already been measured as part of the phase difference because the measurement circuit compares the phase difference between phase modified clock A signal 345 and the phase modified clock B signal 355. The selection of the short path or the long path of each phase modifying element is the only modification that changes the overall phase difference.

According to an embodiment of the present invention, each phase modifying element of the phase aligner can be designed as a hard macro in an integrated circuit defining specific timing requirements for the long path and the short path. The three phase modifying elements (coarse, medium and fine) are designed as configurable logic blocks, using a FPGA editor or other such tool to specify the phase adjustments of the short and long paths. Once defined, the coarse, medium and fine phase modifying elements are duplicated and linked in series to provide the desired amount of phase adjustment capability the design requires.

FIG. 6 illustrates an example phase measurement circuit. Various phase measurement circuits can be utilized, and FIG. 6 is an example of one such circuit. Referring to FIG. 6, two clocks, CLOCK 1 and CLOCK 2, are sent to phase detector 610. Phase detector 610 can be a commercially available part such as Digital Phase/Frequency Discriminator AD9901™ from Analog Devices, Inc. The output of the phase detector has a voltage swing, such as from 3.2–5 volts, based on the phase alignment of the two clocks. The output duty cycle is proportional to the phase difference of the two clock inputs. The output of the phase detector is sent to a RC (resistor—capacitor) circuit made up of resistor R1 and capacitor C1. The output of phase detector 610 charges capacitor C1. Comparator 620 compares the charge of capacitor C1 to a specific voltage, such as 3.3V. Comparator 620 can be a commercially available part such as Comparator Max999™ from Maxim Integrated Products, Inc. Once capacitor C1 is charged to a specified value, such as 3.3V, output of comparator 620, a stop signal, is activated. By counting the amount of time from the beginning of measurement to the activation of the stop signal, the amount of phase difference can be quantified. For example, the faster capacitor C1 charges, the greater the phase difference between the two clock signals. The capacitor must be discharged prior to commencement of the measuring of the phase difference.

A counter in reporting circuit 330 can be utilized to determine the length of time capacitor C1 charges to a specific value. First, the counter is reset and capacitor C1 is discharged with the measurement activation signal. Next, the counter is stopped when capacitor C1 is charged to a certain value, indicated by the stop signal. A processor is notified that the counter has stopped, either by sending an interrupt or allowing software to poll a register. The value of the counter is read to determine the phase misalignment. The necessary amount of phase adjustment to bring the two clocks into alignment is calculated and added to the standby clock. The process of measuring and adding is iterative until the phase difference is reduced to a certain minimum value.

Figure 7:
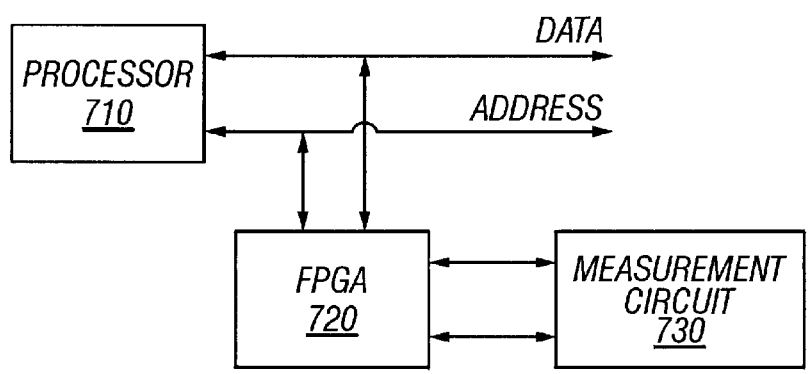
FIG. 7 illustrates a block diagram of portions of a system suitable for implementing embodiments of the present invention.

FIG. 7 illustrates a block diagram of portions of a system suitable for implementing embodiments of the present invention. The control of the phase aligner is performed by software operating on a processor, for example, a Motorola 68860 microcontroller. Referring to FIG. 7, processor 710 is coupled to FPGA 720 via address and data lines. The digital phase alignment circuitry is contained within FPGA 720. FPGA 720 communicates with measurement circuit 730 as previously described in FIG. 3. Software utilizes the data and address lines to read and write registers contained within FPGA 720. Each register has a different address. The registers of the phase aligner include the coarse, medium and fine software registers for selecting a variable amount of phase adjustment, one each for clock A and clock B; measurement start and stop bits; an active clock selection bit; a register for either the interrupt or polling circuitry; and a register for the counter read bits. Other devices (not shown) coupled to processor 710 and FPGA 720 via the data and address lines can include memory, input and output peripheral devices, etc.

The operation of a system utilizing a processor such as that shown in FIG. 7 is readily known in the art and is not discussed here in detail. Code to implement the present invention can be operably disposed or stored in computer-readable storage media such as one or more of a system memory, a fixed disk, a CD-ROM, a floppy disk or the like.

Figure 8:
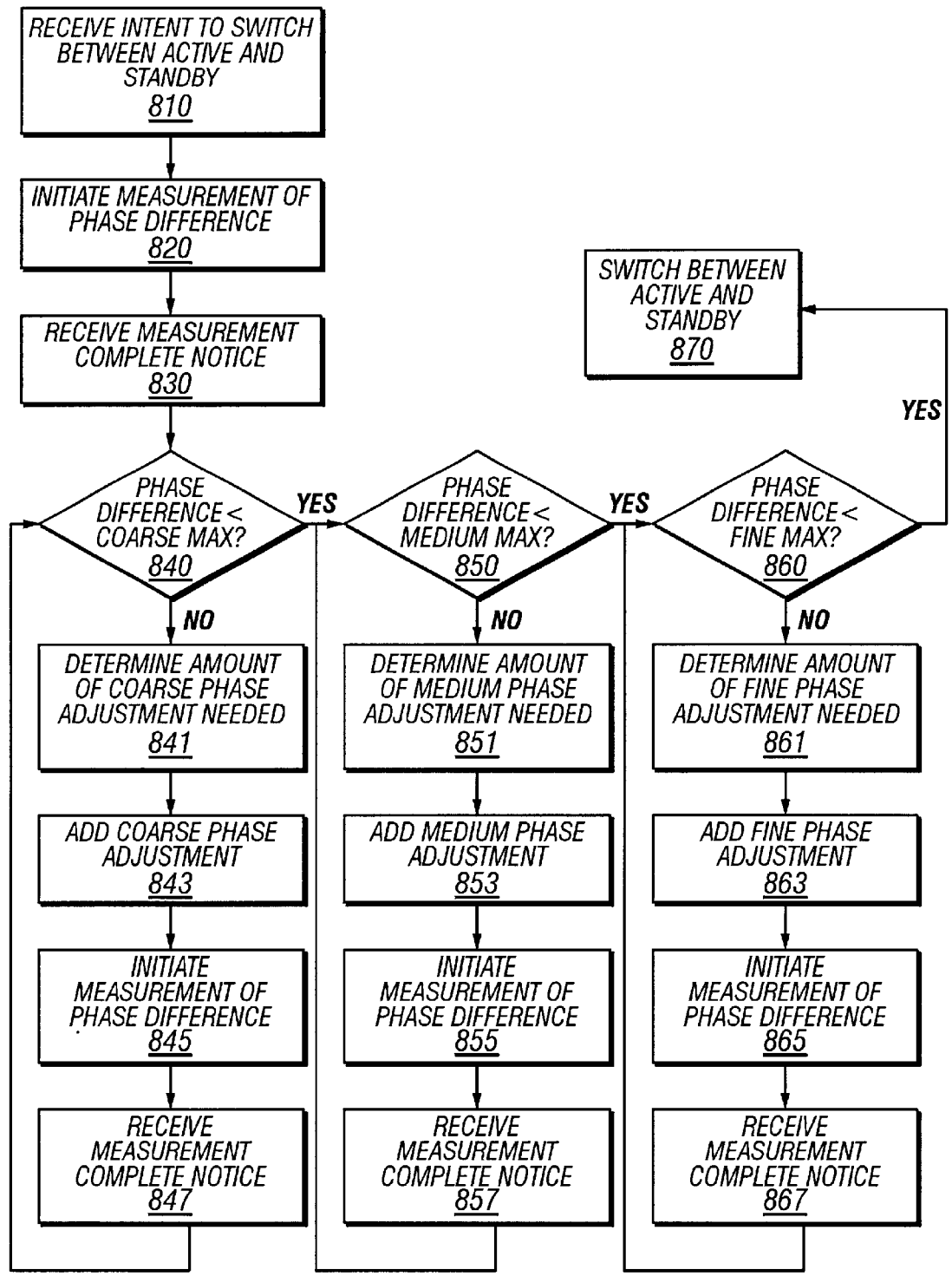
FIG. 8 illustrates a method of phase alignment according to an embodiment of the present invention.

FIG. 8 illustrates a method of phase alignment according to an embodiment of the present invention. A notification of the intent to switch between active and standby circuitry, and the associated clocks are received beginning the phase alignment, step 810. The need for switching can be prompted by maintenance or upgrade on the active circuitry or due to failures of the active circuitry.

The measurement of the phase difference between an active clock and a standby clock is initiated, step 820. Notification is received upon the completion of measurement, step 830.

Software determines the necessary amount of phase adjustment to be added to the standby clock to phase align the standby clock with the active clock. If the phase adjustment is not less than the maximum phase adjustment able to be added by a coarse phase modifying element, step 840, software determines the amount of coarse phase adjustment to be added, step 841. For example, if the coarse maximum is 1.5 ns as in the previous example embodiment, and the measured phase difference is 4 ns, the phase difference is not less than the coarse maximum. Therefore, software will determine the amount of coarse phase adjustment to be added. Once determined, software writes to the coarse software register to select the amount of coarse phase adjustment needed, step 843. In the example, software could select two additional coarse phase modifying element long paths, adding up to 3 ns to the phase of the standby clock. The measurement of the phase difference between the active and the modified standby clock is initiated, 845. Notification is received upon the completion of measurement, step 847. Additional measurements are required since the additional phase adjustment added by a long path can vary by 30% due to process, temperature and voltage variations. After measuring, the phase aligner returns to determining if the phase adjustment is less than the maximum phase adjustment able to be added by a coarse phase modifying element, step 840.

If the required phase adjustment is less than the maximum phase adjustment able to be added by a coarse phase modifying element, software determines if the phase adjustment is not less than the maximum phase adjustment able to be added by a medium phase modifying element, step 850. If the required phase adjustment is not less than the maximum phase adjustment able to be added by a medium phase modifying element, step 850, then software determines the amount of medium phase adjustment needed to be added to standby clock, step 851. Once determined, software writes to the medium software register to select the amount of medium phase adjustment needed, step 853. The measurement of the phase difference is initiated, 855. Upon receiving a measurement complete notice, step 857, the phase aligner returns to determining if the required phase adjustment is less than the maximum phase adjustment able to be added by a medium phase modifying element, step 850.

If the required phase adjustment is less than the maximum phase adjustment able to be added by a medium phase modifying element, software determines if the phase adjustment is not less than the maximum phase adjustment able to be added by a fine phase modifying element, step 860. If the required phase adjustment is not less than the maximum phase adjustment able to be added by a fine phase modifying element, step 860, then software determines the amount of fine phase adjustment needed to be added to standby clock, step 861. Once determined, software writes to the fine software register to select the amount of fine phase adjustment needed, step 863. The measurement of the phase difference is initiated, 865. Upon receiving a measurement complete notice, step 867, the phase aligner returns to determining if the required phase adjustment is less than the maximum phase adjustment able to be added by a fine phase modifying element, step 860.

If the required phase adjustment is less than the maximum phase adjustment able to be added by a fine phase modifying element, the clocks are considered to be in phase alignment. The active clock can be switched to standby and the standby clock can be switched to active, step 870. The phase adjustment of the new standby clock is set to minimum phase adjustment. The phase alignment and clock switching are complete.

FIG. 8 depicts a flow chart of the operation of a module and method according to an embodiment of the invention. It is appreciated that operations discussed herein may consist of directly entered commands by a computer system user or by steps executed by application specific hardware modules, but the preferred embodiment includes steps executed by software modules. The functionality of steps referred to herein may correspond to the functionality of modules or portions of modules.

The operations referred to herein may be modules or portions of modules (e.g., software, firmware or hardware modules). For example, although the described embodiment includes software modules and/or includes manually entered user commands, the various exemplary modules may be application specific hardware modules. The software modules discussed herein may include script, batch or other executable files, or combinations and/or portions of such files. The software modules may include a computer program or subroutines thereof encoded on computer-readable media.

Additionally, those skilled in the art will recognize that the boundaries between modules are merely illustrative and alternative embodiments may merge modules or impose an alternative decomposition of functionality of modules. For example, the modules discussed herein may be decomposed into submodules to be executed as multiple computer processes. Moreover, alternative embodiments may combine multiple instances of a particular module or submodule. Furthermore, those skilled in the art will recognize that the operations described in exemplary embodiment are for illustration only. Operations may be combined or the functionality of the operations may be distributed in additional operations in accordance with the invention.

In another embodiment of the present invention, software sets fine, medium and coarse software registers at one time, reducing the amount of time required to phase align the signals. Due to the 30% variation in the phase adjustment ability of the phase modifying elements, several iterations may still be required to phase align the signals.

Also, while particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A phase adjustment circuit comprising:
 a signal path comprising a first plurality of phase adjustment elements, each of the phase adjustment elements is coupled to at least one other of the phase adjustment elements, wherein
  each of the phase adjustment elements of the first plurality comprises a first path and a second path,
  the second path of each of the phase adjustment elements of the first plurality adds a smaller amount of phase adjustment to the signal path than the first path of each of the phase adjustment elements of the first plurality, and
  the amount of phase adjustment added by each of the phase adjustment elements of the first plurality is cumulative;
 a selection circuit coupled to each of the phase adjustment elements of the first plurality and configured to select one of the first path and the second path of each of the phase adjustment elements of the first plurality;
 a second plurality of phase adjustment elements coupled to the first plurality of phase adjustment elements, each of the phase adjustment elements of the second plurality is coupled to at least one other of the phase adjustment elements of the first and second pluralities, wherein
  each of the phase adjustment elements of the second plurality comprises a first path and a second path,
  the second path of each of the phase adjustment elements of the second plurality adds a smaller amount of phase adjustment to the signal path than the first path of each of the phase adjustment elements of the second plurality, and
  the amount of phase adjustment added by each of the phase adjustment elements of the second plurality is cumulative;
 a second selection circuit coupled to each of the phase adjustment elements of the second plurality and configured to select one of the first path and the second path of each of the phase adjustment elements of the second plurality;
 a third plurality of phase adjustment elements coupled to the first plurality of phase adjustment elements, each of the phase adjustment elements of the third plurality is coupled to at least one other of the phase adjustment elements of the first, second and third pluralities, wherein
  each of the phase adjustment elements of the third plurality comprises a first path and a second path,
  the second path of each of the phase adjustment elements of the third plurality adds a smaller amount of phase adjustment to the signal path than the first path of each of the phase adjustment elements of the third plurality, and
  the amount of phase adjustment added by each of the phase adjustment elements of the third plurality is cumulative; and
 a third selection circuit coupled to each of the phase adjustment elements of the third plurality and configured to select one of the first path and the second path of each of the phase adjustment elements of the third plurality.

2. The phase adjustment circuit as recited in claim 1, wherein the first plurality of phase adjustment elements are coupled in series.

3. The phase adjustment circuit as recited in claim 1, wherein the first path of each of the phase adjustment elements of the first plurality adds a greater amount of phase adjustment to the signal path than the first path of each of the phase adjustment elements of the second plurality.

4. The phase adjustment circuit as recited in claim 1, wherein the first and second plurality of phase adjustment elements are coupled in series.

5. The phase adjustment circuit as recited in claim 1, wherein the first path of each of the phase adjustment elements of the first plurality adds a greater amount of phase adjustment to the signal path than the first path of each of the phase adjustment elements of the third plurality, and wherein the first path of each of the phase adjustment elements of the second plurality adds a greater amount of phase adjustment to the signal path than the first path of each of the phase adjustment elements of the third plurality.

6. The phase adjustment circuit as recited in claim 1, wherein the first, second and third pluralities of phase adjustment elements are coupled in series.

7. The phase adjustment circuit as recited in claim 1, wherein each selection circuit of the first, second and third selection circuits comprises:
   a register having a plurality of bits that are writable by a processor; and
   a plurality of multiplexers, each of the plurality of multiplexers having a select line coupled to a bit in the first plurality of bits, a first input coupled to the first path of each of the phase adjustment elements, and a second input coupled to the second path of each of the phase adjustment elements.

8. The phase adjustment circuit as recited in claim 1, wherein the phase adjustment circuit is implemented in a field programmable gate array.

9. The phase adjustment circuit as recited in claim 8, wherein a layout and routing restriction for the field programmable gate array is limited to the layout and routing of each of the phase adjustment elements in each of the first, second and third pluralities.

10. A method comprising:
   for each of a first plurality of phase adjustment elements, selecting between a first path and a second path of each of the phase adjustment elements, wherein a phase adjustment provided by the first path is greater than a phase adjustment provided by the second path;
   for each of a second plurality of phase adjustment elements, selecting between a first path and a second path of each of the phase adjustment elements of the second plurality, wherein
      a phase adjustment provided by the first path of each of the phase adjustment elements of the second plurality is greater than a phase adjustment provided by the second path of each of the phase adjustment elements of the second plurality, and
      the first path of each of the first plurality of phase adjustment elements adds a greater amount of phase adjustment to the signal path than the first path of each of the second plurality of phase adjustment elements; and
   for each of a third plurality of phase adjustment elements, selecting between a first path and a second path of each of the phase adjustment elements of the third plurality, wherein
      a phase adjustment provided by the first path of each of the phase adjustment elements of the third plurality is greater than a phase adjustment provided by the second path of each of the phase adjustment elements of the third plurality, and
      the first path of each of the first plurality of phase adjustment elements adds a greater amount of phase adjustment to the signal path than the first path of each of the third plurality of phase adjustment elements, and
      the first path of each of the second plurality of phase adjustment elements adds a greater amount of phase adjustment to the signal path than the first path of each of the third plurality of phase adjustment elements.

11. The method as recited in claim 10, wherein selecting the phase adjustment in each of the first, second, and third pluralities comprises:
   writing a plurality of bits in a register, the plurality of bits coupled to a plurality of select lines of a plurality of multiplexers for selecting either the first path or second path of each of the phase adjustment elements in the first, second and third pluralities.

12. A computer readable medium comprising a set of instructions for enabling a system to:
   for each of a first plurality of phase adjustment elements, select between a first path and a second path of each of the phase adjustment elements of the first plurality, wherein a phase adjustment provided by the first path is greater than a phase adjustment provided by the second path;
   for each of a second plurality of phase adjustment elements, select between a first path and a second path of each of the phase adjustment elements of the second plurality, wherein
      a phase adjustment provided by the first path of each of the phase adjustment elements of the second plurality is greater than a phase adjustment provided by the second path of each of the phase adjustment elements of the second plurality, and
      the first path of each of the first plurality of phase adjustment elements adds a greater amount of phase adjustment to the signal path than the first path of each of the second plurality of phase adjustment elements; and
   for each of a third plurality of phase adjustment elements, select between a first path and a second path of each of the phase adjustment elements of the third plurality, wherein
      a phase adjustment provided by the first path of each of the phase adjustment elements of the third plurality is greater than a phase adjustment provided by the second path of each of the phase adjustment elements of the third plurality, and
      the first path of each of the first plurality of phase adjustment elements adds a greater amount of phase adjustment to the signal path than the first path of each of the third plurality of phase adjustment elements, and
      the first path of each of the second plurality of phase adjustment elements adds a greater amount of phase adjustment to the signal path than the first path of each of the third plurality of phase adjustment elements.

13. The computer readable medium as recited in claim 12, wherein to select a first path or a second path for each of the first, second, and third pluralities comprises to write a plurality of bits in a register, the plurality of bits coupled to a plurality of select lines of a plurality of multiplexers for selecting either the first path or second path of each of the phase adjustment elements in the first, second and third pluralities.

14. A phase adjustment circuit comprising:

for each of a first plurality of phase adjustment elements, means for selecting between a first path and a second path of each of the phase adjustment elements, wherein a phase adjustment provided by the first path is greater than a phase adjustment provided by the second path;

for each of a second plurality of phase adjustment elements, means for selecting between a first path and a second path of each of the phase adjustment elements of the second plurality, wherein a phase adjustment provided by the first path of each of the phase adjustment elements of the second plurality is greater than a phase adjustment provided by the second path of each of the phase adjustment elements of the second plurality, and the first path of each of the first plurality of phase adjustment elements adds a greater amount of phase adjustment to the signal path than the first path of each of the second plurality of phase adjustment elements; and for each of a third plurality of phase adjustment elements, means for selecting between a first path and a second path of each of the phase adjustment elements of the third plurality, wherein a phase adjustment provided by the first path of each of the phase adjustment elements of the third plurality is greater than a phase adjustment provided by the second path of each of the phase adjustment elements of the third plurality, and the first path of each of the first plurality of phase adjustment elements adds a greater amount of phase adjustment to the signal path than the first path of each of the third plurality of phase adjustment elements, and the first path of each of the second plurality of phase adjustment elements adds a greater amount of phase adjustment to the signal path than the first path of each of the third plurality of phase adjustment elements.

15. The phase adjustment circuit as recited in claim 14, wherein the means for selecting the phase adjustment for each of the first, second, and third pluralities comprises:

means for writing a plurality of bits in a register, the plurality of bits coupled to a plurality of select lines of a plurality of multiplexers for selecting either the first path or second path of each of the phase adjustment elements in the first, second, and third pluralities.

16. The phase adjustment circuit as recited in claim 1, wherein the phase adjustment circuit is implemented in a programmable device.

17. A method of designing a phase adjustment circuit in a programmable device comprising:

implementing a signal path comprising a first plurality of phase adjustment elements, each of the phase adjustment elements of the first plurality coupled to at least one other of the phase adjustment elements of the first plurality, wherein each of the phase adjustment elements of the first plurality comprises a first path and a second path, the second path of each of the phase adjustment elements of the first plurality adds a smaller amount of phase adjustment to the signal path than the first path of each of the phase adjustment elements of the first plurality, and the amount of phase adjustment added by each of the phase adjustment element of the plurality is cumulative; and implementing a first selection circuit coupled to each of the phase adjustment elements of the first plurality to provide selection of either the first path or the second path of each of the phase adjustment elements of the first plurality;

the signal path further comprising a second plurality of phase adjustment elements, each of the phase adjustment elements of the second plurality coupled to at least one other of the phase adjustment elements of the first and second pluralities, wherein each of the phase adjustment elements of the second plurality comprises a first path and a second path, the second path of each of the phase adjustment elements of the second plurality adds a smaller amount of phase adjustment to the signal path than the first path of each of the phase adjustment elements of the second plurality, and the amount of phase adjustment added by each of the phase adjustment element of the second plurality is cumulative; and implementing a second selection circuit coupled to each of the phase adjustment elements of the second plurality to provide selection of either the first path or the second path of each of the phase adjustment elements of the second plurality; and the signal path further comprising a third plurality of phase adjustment elements, each of the phase adjustment elements of the third plurality coupled to at least one other of the phase adjustment elements of the first, second and third pluralities, wherein each of the phase adjustment elements of the third plurality comprises a first path and a second path, the second path of each of the phase adjustment elements of the third plurality adds a smaller amount of phase adjustment to the signal path than the first path of each of the phase adjustment elements of the third plurality, and the amount of phase adjustment added by each of the phase adjustment element of the plurality is cumulative;

implementing a third selection circuit coupled to each of the phase adjustment elements of the third plurality to provide selection of either the first path or the second path of each of the phase adjustment elements of the third plurality; and restricting only a small portion of the signal path to routing restrictions.

* * * * *